United States Patent
Liu et al.

(10) Patent No.: US 7,558,338 B2
(45) Date of Patent: Jul. 7, 2009

(54) METHOD AND APPARATUS FOR I/Q IMBALANCE ESTIMATION

(75) Inventors: Der-Zheng Liu, Tainan (TW); Song-Nien Tung, Kaohsiung (TW); Kuang-Yu Yen, Taichung (TW); Tai-Cheng Liu, Kaohsiung (TW)

(73) Assignee: Realtek Semiconductor Corp., Hsinchu (TW)

( * ) Notice: Subject to any disclaimer, the term of this patent is extended or adjusted under 35 U.S.C. 154(b) by 1041 days.

(21) Appl. No.: 10/649,862

(22) Filed: Aug. 28, 2003

(65) Prior Publication Data

US 2004/0095993 A1   May 20, 2004

(30) Foreign Application Priority Data

Nov. 20, 2002   (TW) .............................. 91133808 A

(51) Int. Cl.
 *H04L 27/00*   (2006.01)
(52) U.S. Cl. ...................................... 375/317
(58) Field of Classification Search ................. 375/316, 375/317, 340, 324, 219, 295
 See application file for complete search history.

(56) References Cited

U.S. PATENT DOCUMENTS 6,498,822 B1 * 12/2002 Tanaka ........................ 375/354
2004/0125732 A1 * 7/2004 Cheng et al. ............. 369/59.27

FOREIGN PATENT DOCUMENTS

| JP | 07-327023 | 12/1995 |
| JP | 09-153882 | 6/1997 |
| JP | 09153882 | * 10/1997 |

OTHER PUBLICATIONS

Machine translation of JP 09-153882.*
"Frequency Domain Equalization of IQ Imbalance in OFDM Receivers" TUAM 3.4 p. 28-29 Andreas Schuchert and Martin Buchholz 2001 IEEE.
"Analysis of IQ Imbalance on Initial Frequency Offset Estimation in Direct Down-Conversion Receivers" p. 158-161, Vincent K.-P. Ma and Tommi Ylamurto 2001 IEEE.
"A Novel IQ Imbalance Compensation Scheme for The Reception of OFDM Signals" p. 313-318 Andreas Schuchert and Ralph Hasholzner 2001 IEEE.
"Efects of Tuner IQ Imbalance on Multicarrier-Modulation Systems" 2000 IEEE Martin Buchholz, Andreas Schuchert and Ralph Hasholzner 5 un-numbered pages.
Buchholz, Martin et al., Effects of Tuner IQ Imbalance on Multicarrier-Modulation Systems, IEEE, 2000.

* cited by examiner

*Primary Examiner*—Kevin M Burd
(74) *Attorney, Agent, or Firm*—Thomas, Kayden, Horstemeyer & Risley

(57) ABSTRACT

An apparatus and method for estimating an I/Q imbalance parameter of a receiver and a transmitter. An apparatus for estimating an I/Q imbalance parameter of a receiver, the apparatus comprising: a signal generator; a transmitter; a receiver; and an estimator. An apparatus for estimating an I/Q imbalance parameter of a transmitter, the apparatus comprising: a signal generator; a transmitter; and an estimator.

18 Claims, 5 Drawing Sheets

METHOD AND APPARATUS FOR I/Q IMBALANCE ESTIMATION

BACKGROUND OF THE INVENTION

1. Field of the Invention

The present invention relates to signal estimation and compensation, and particularly to a method and apparatus for I/Q imbalance compensation and estimation.

2. Description of the Prior Art

In a quadrature modulation/demodulation system, the real and imaginary parts of a baseband time-domain complex signal are transmitted simultaneously from the transmitter. They are carried on two orthogonal carriers (sine and cosine waves), respectively. The receiver uses the same orthogonal carriers to demodulate the received signal and derives the original real and imaginary part of the baseband complex signal. The modulation/demodulation of the real part of the baseband complex signal is called in-phase (I) modulation/demodulation while that of the imaginary part is called quadrature-phase (Q) modulation/demodulation.

In practice, there is always a mismatch between I and Q modulation/demodulation, that is to say, there are always gain and phase offset in the I/Q modulated (or demodulated) signals. This is the I/Q imbalance known in the art.

FIGS. 1A and 1B are diagrams respectively showing the I/Q imbalance at the receiver and transmitter. As shown in the figures, crosstalk occurs due to I/Q imbalance, which can not be eliminated even with the ACG (automatic gain control) and carrier recovery circuitry. Further, ICI (inter carrier interference) also occurs for OFDM signals.

Conventionally, the solution to the previous problem is a circuitry system carefully designed to alleviate the I/Q imbalance. However, in an OFDM system, ICI is easily caused by I/Q imbalance because multi-carriers are used for high-speed transmission. This raises a need for a correction circuitry system, such as an equalizer or ICI eliminator. Even worse, in an OFDM system used for wireless LAN using burst mode transmission, the equalizer or ICI eliminator cannot achieve adequate compensation of I/Q imbalance.

SUMMARY OF THE INVENTION

The present invention provides a method for receiver I/Q imbalance estimation comprising the steps of transmitting a first OFDM signal by a first and second modulated carrier through a same modulation path at a transmitter, receiving the first OFDM signal by a first and second demodulated carrier respectively through a first and second demodulation path at a receiver, transmitting a second OFDM signal by the first and second modulated carrier through the same modulation path at the transmitter, receiving the second OFDM signal by the first and second demodulated carrier respectively through the first and second demodulation path at the receiver, and deriving an I/Q imbalance of the receiver by the first and second OFDM signal, wherein the first and second OFDM signal are symmetrical in frequency domain.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE INVENTION

In the following embodiment of the invention, since there is usually no rapid variation in I/Q imbalance, the imbalance is estimated and corrected based upon the characters of the OFDM transmitter or receiver when the system being started or idled.

Figure 1A:
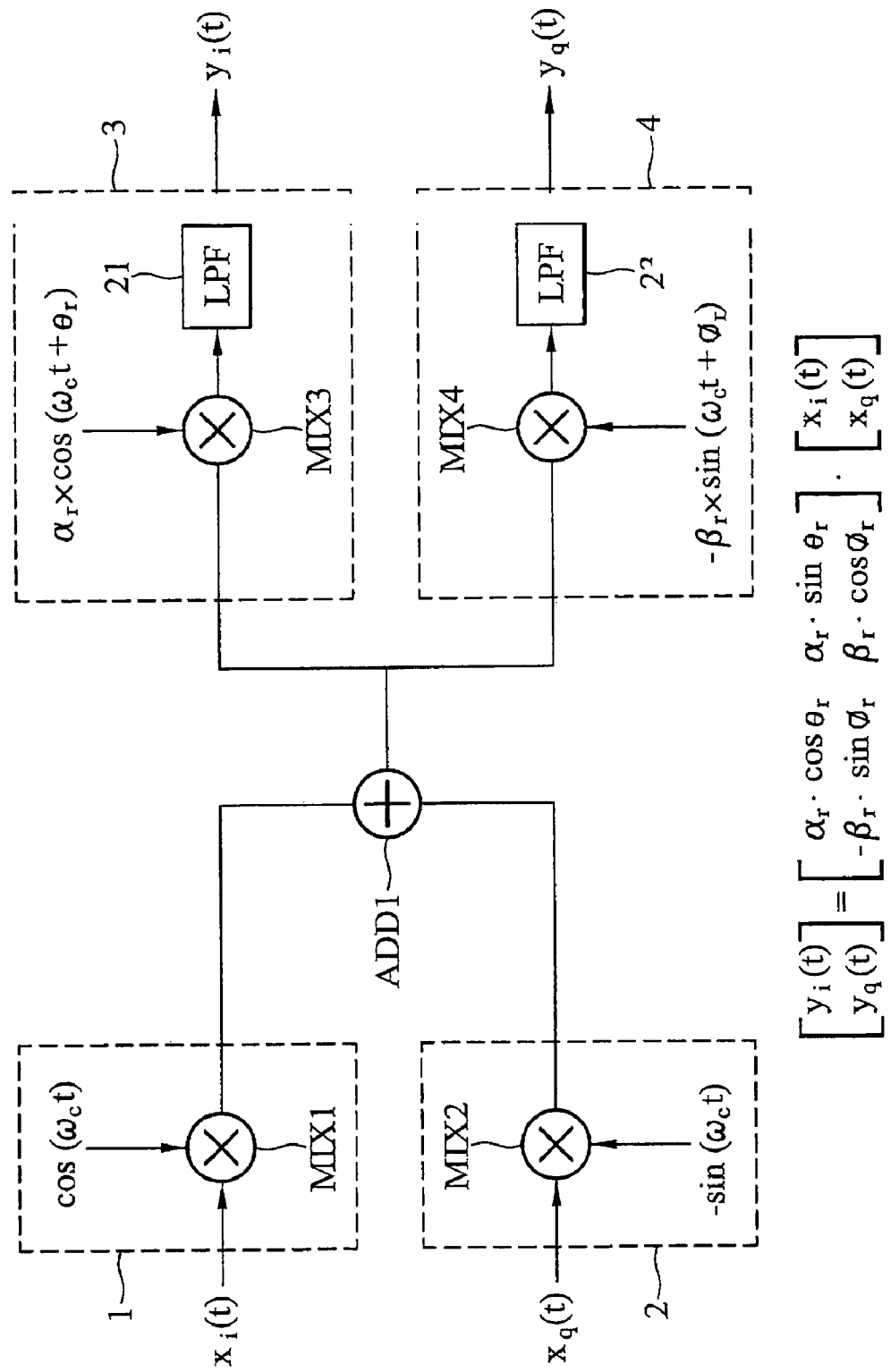
FIGS. 1A and 1B are diagrams respectively showing the I/Q imbalance at the receiver and transmitter.

As shown in FIG. 1A, the I/Q imbalance at the receiver is expressed as a 2*2 matrix function composed of parameters $\alpha_r \cos \theta_r$, $\alpha_r \sin \theta_r$, $\beta_r \cos \phi_r$, and $\beta_r \sin \phi_r$, where $\alpha_r$ and $\beta_r$ are gain offsets while $\theta_r$ and $\phi_r$ are phase offsets of the I and Q demodulation path in the receiver. The four parameters of the receiver I/Q imbalance matrix can be estimated in an embodiment of the present invention by generating a signal with a specific frequency before inverse fast Fourier Transform (IFFT). The signal with the specific frequency is transmitted in the from of a time-domain signal with either imaginary or real part power. Thus, the signal is transmitted through only one of the I and Q modulation paths of the transmitter. The gain and phase offsets of the signal can be compensated by the automatic gain control and carrier recovery circuit in the receiver. In this manner, the parameters $\alpha_r \cos \theta_r$ and $\beta_r \sin \theta_r$ are derived through transmitting a time-domain real part power signal while the parameters $\alpha_r \sin \theta_r$ and $\beta_r \cos \theta_r$ are derived through transmitting from a time-domain imaginary part power signal.

Figure 1B:
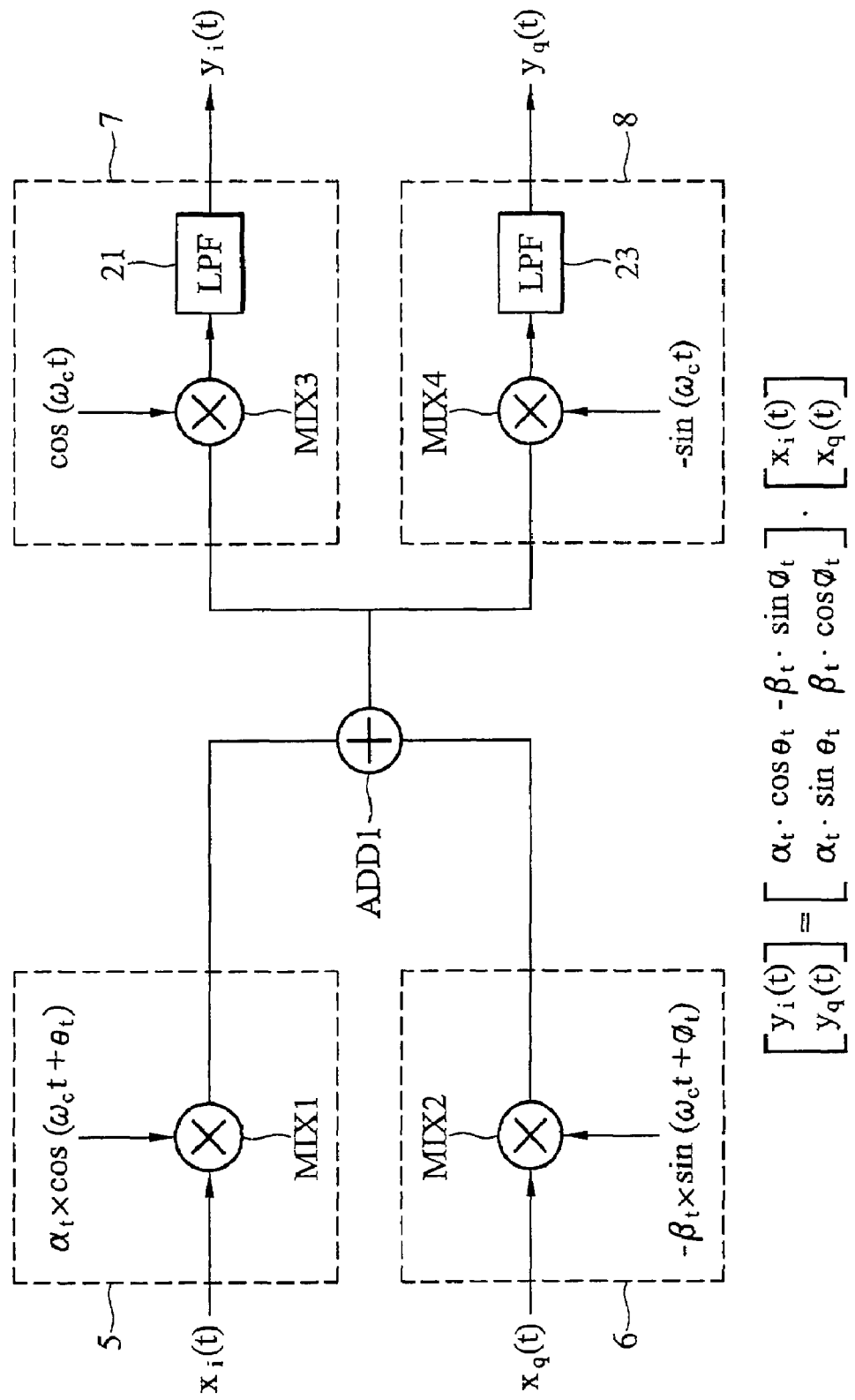

As shown in FIG. 1B, the I/Q imbalance at the transmitter is expressed as a 2*2 matrix function composed of parameters $\alpha_t \cos \theta_t$, $\alpha_t \sin \theta_t$, $\beta_t \cos \phi_t$, and $\beta_t \sin \phi_t$, where $\alpha_t$ and $\beta_t$ are gain offsets while $\theta_t$ and $\phi_t$ are phase offsets of the I and Q modulation path in the transmitter. The four parameters of the transmitter I/Q imbalance matrix can be estimated in an embodiment of the present invention by transmitting two signals, each of which includes the power of the real and imaginary part in the time domain, in two different periods and demodulating them at the receiver through the same demodulation path. In the demodulation of each signal received by the receiver, two orthogonal carriers are used to respectively demodulate the real and imaginary parts of time-domain signals from the received signal. The parameters $\alpha_t \cos \theta_t$ and $\beta_t \sin \theta_t$ are derived from the real part of two receiving signals while the parameters $\alpha_r \sin \theta_r$ and $\beta_r \cos \theta_r$ are derived from the imaginary part of two receiving signals. The estimated signal may include the gain and phase offsets. However, it can be compensated by channel effect processing.

Accordingly, the I/Q imbalance estimation is based on transmitting/receiving signal through one single modulation/demodulation path to estimate the I/Q imbalance parameters. The baseband signal for the imbalance estimation should be properly selected to simplify the estimation process.

Figure 2:
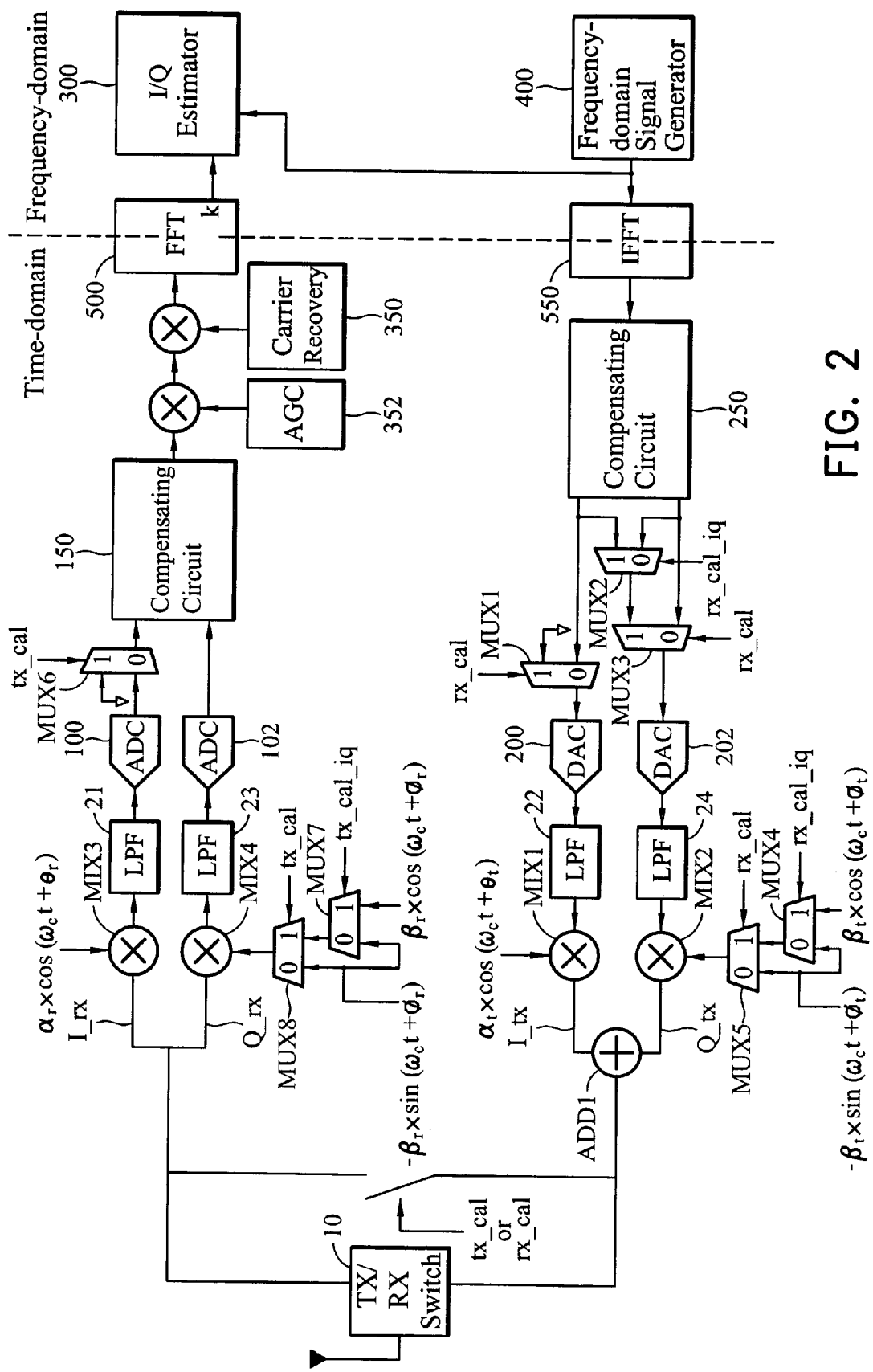
FIG. 2 is a diagram showing an apparatus for estimation and compensation of I/Q imbalance according to one embodiment of the invention.

FIG. 2 is a diagram showing an apparatus for estimation and compensation of I/Q imbalance according to one embodiment of the invention. The frequency-domain signal generator 400 transmits a signal to the IFFT processor 550 converting the signal from frequency domain to time domain. The time-domain signal is sent to the transmitting compensating matrix circuit 250. The I modulation path of the transmitter includes a multiplexer MUX1, a D/A converter 200, a low-pass filter 22, and a mixer MIX1. The Q modulation path of the transmitter includes multiplexers MUX2, MUX3, MUX4, and MUX5, a D/A converter 202, low-pass filter 24, and mixer MIX2. The multiplexer MUX1 switch signals in the I modulation path while the multiplexers MUX2 and MUX3 switches signals in the Q modulation path. The multiplexers MUX4 and MUX5 select carriers for the I and Q modulation paths.

The I demodulation path of the receiver includes a mixer MIX3, a low-pass filter 21, an A/D converter 100 and a multiplexer MUX6. The Q demodulation path of the receiver includes a mixer MIX4, a low-pass filter 23, an A/D converter 102, and multiplexers MUX 7 and MUX8. The signals going through the I and Q demodulation paths are sent to the receiving compensating matrix circuit 150 and then processed by the AGC circuit 352 and carrier recovery circuit 350. The FFT processor 500 converts the signal from the carrier recovery circuit 350 to a frequency-domain signal. The estimator 300 generates the parameters for the transmitting/receiving compensating matrix circuits 150 and 250. The multiplexer MUX6 switches signals in the I demodulation path while the multiplexers MUX7 and MUX8 select carriers for the I and Q demodulation paths.

The A/D converters 100 and 102 are followed by the receiving compensating matrix circuit 150 for compensation of the I/Q imbalance. Similarly, the D/A converters 200 and 202 are preceded by the transmitting compensating matrix circuit 250 for the same reason.

As shown in FIG. 1A, the receiver I/Q imbalance is expressed as:

$$\begin{bmatrix} y_i(t) \\ y_q(t) \end{bmatrix} = \begin{bmatrix} \alpha_r \cos\theta_r & \alpha_r \sin\theta_r \\ -\beta_r \sin\phi_r & \beta_r \cos\phi_r \end{bmatrix} \cdot \begin{bmatrix} x_i(t) \\ x_q(t) \end{bmatrix} \quad (1)$$

Thus, by deriving the four parameters $\alpha_r \cos\theta_r$, $\alpha_r \sin\theta_r$, $\beta_r \cos\phi_r$ and $\beta_r \sin\phi_r$, the compensation done by the receiving compensating matrix circuit 150 turns to be a matrix function:

$$\begin{bmatrix} \beta_r \cos\phi_r & -\alpha_r \sin\theta_r \\ \beta_r \sin\phi_r & \alpha_r \cos\theta_r \end{bmatrix} \quad (2)$$

The received signal is then expressed as:

$$\begin{bmatrix} r_i(t) \\ r_q(t) \end{bmatrix} = \begin{bmatrix} \beta_r \cos\phi_r & -\alpha_r \sin\theta_r \\ \beta_r \sin\phi_r & \alpha_r \cos\theta_r \end{bmatrix} \cdot \begin{bmatrix} y_i(t) \\ y_q(t) \end{bmatrix} \quad (3)$$

$$= \begin{bmatrix} \beta_r \cos\phi_r & -\alpha_r \sin\theta_r \\ \beta_r \sin\phi_r & \alpha_r \cos\theta_r \end{bmatrix} \cdot \begin{bmatrix} \alpha_r \cos\theta_r & \alpha_r \sin\theta_r \\ -\beta_r \sin\phi_r & \beta_r \cos\phi_r \end{bmatrix} \cdot \begin{bmatrix} x_i(t) \\ x_q(t) \end{bmatrix}$$

$$= [\alpha_r \cdot \beta_r \cdot \cos(\theta_r - \phi_r)] \cdot \begin{bmatrix} 1 & 0 \\ 0 & 1 \end{bmatrix} \cdot \begin{bmatrix} x_i(t) \\ x_q(t) \end{bmatrix} \quad (4)$$

$[\alpha_r \cdot \beta_r \cdot \cos(\theta_r - \phi_r)]$ is the residual gain offset which is further compensated by the AGC circuit. The phase difference between the transmitted and received signal has no impact on the compensation since it is eliminated by the carrier recovery circuit.

Similarly, by deriving the four parameters $\alpha_t \cos\theta_t$, $\alpha_t \sin\theta_t$, $\beta_t \cos\phi_t$ and $\beta_t \sin\phi_t$, the compensation of the transmitter I/Q imbalance done by the transmitting compensating matrix circuit 250 turns to be a matrix function:

$$\begin{bmatrix} \beta_t \cos\phi_t & \beta_t \sin\phi_t \\ -\alpha_t \sin\theta_t & \alpha_t \cos\theta_t \end{bmatrix} \quad (5)$$

The compensated signal is then expressed as:

$$\begin{bmatrix} y_i(t) \\ y_q(t) \end{bmatrix} = \begin{bmatrix} \alpha_t \cos\theta_t & -\beta_t \sin\phi_t \\ \alpha_t \sin\theta_t & \beta_t \cos\phi_t \end{bmatrix} \cdot \begin{bmatrix} v_i(t) \\ v_q(t) \end{bmatrix} \quad (6)$$

$$= \begin{bmatrix} \alpha_t \cos\theta_t & -\beta_t \sin\phi_t \\ \alpha_t \sin\theta_t & \beta_t \cos\phi_t \end{bmatrix} \cdot \begin{bmatrix} \beta_t \cos\phi_t & \beta_t \sin\phi_t \\ -\alpha_t \sin\theta_t & \alpha_t \cos\theta_t \end{bmatrix} \cdot \begin{bmatrix} x_i(t) \\ x_q(t) \end{bmatrix}$$

$$= [\alpha_t \cdot \beta_t \cdot \cos(\theta_t - \phi_t)] \cdot \begin{bmatrix} 1 & 0 \\ 0 & 1 \end{bmatrix} \cdot \begin{bmatrix} x_i(t) \\ x_q(t) \end{bmatrix} \quad (7)$$

These parameters can be identified by correlation of a predetermined OFDM signal with that after an imbalanced I/Q modulation/demodulation.

When a signal x ($x_i + jx_q$) is converted to a signal y ($y_i + jy_q$) by a function:

$$\begin{bmatrix} y_i \\ y_q \end{bmatrix} = \begin{bmatrix} A_{11} & A_{12} \\ A_{21} & A_{22} \end{bmatrix} \cdot \begin{bmatrix} x_i \\ x_q \end{bmatrix}, \quad (8)$$

the signal y is a linear combination of x and x*, and can be expressed as:

$$y = C \cdot x + D \cdot x^* \quad (9)$$

where $C = c_i + jc_q$, $D = d_i + jd_q$, $c_i + d_i = A_{11}$, $-c_q + d_q = A_{12}$, $c_q + d_q = A_{21}$ and $c_i - d_i = A_{22}$.

If the signal x(t) is a complex OFDM signal, then $$x(t) = \sum_{k=-\frac{N}{2}}^{\frac{N}{2}} a_k \cdot e^{j2\pi f_x t} \quad (10)$$

$$y(t) = \sum_{k=-\frac{N}{2}}^{\frac{N}{2}} (C \cdot a_k + D \cdot a_{-k}) \cdot e^{j2\pi f_x t} \quad (11)$$

$$= \sum_{k=-\frac{N}{2}}^{\frac{N}{2}} \hat{a}_k \cdot e^{j2\pi f_x t} \quad (12)$$

where $\hat{a}_k$ can be expressed by the following matrix form:

$$\begin{bmatrix} \hat{a}_{k,i} \\ \hat{a}_{k,q} \end{bmatrix} = \begin{bmatrix} c_i & -c_q \\ c_q & c_i \end{bmatrix} \cdot \begin{bmatrix} a_{k,i} \\ a_{k,q} \end{bmatrix} + \begin{bmatrix} d_i & d_q \\ d_q & -d_i \end{bmatrix} \cdot \begin{bmatrix} a_{-k,i} \\ a_{-k,q} \end{bmatrix}, \quad (13)$$

where $a_k$ is the frequency-domain signal in $k^{th}$ sub-channel, $a_{k,i}$ is the real part of $a_k$ and $a_{k,q}$ is the imaginary part of $a_k$.

Thus, the parameters used for compensating the I/Q imbalance can be derived by the equation (13) and characteristics of the OFDM signal. In order to avoid the impact of the transmitter I/Q imbalance, only one single demodulation path (either real-part modulation path I_tx or imaginary-part modulation path Q_tx of the transmitting node) is used during the estimation of the receiver I/Q imbalance. When $a_{k,i}=a_{-k,i}$ (symmetric) and $a_{k,q}=-a_{-k,q}$(anti-symmetric), only a real-part time-domain OFDM signal is transmitted. By transmitting this signal through only one of the I and Q modulation paths (In this embodiment, the signal is transmitted through the Q modulation path and carried by a cosine ($\cos(\omega_c t)$) carrier wave) and demodulating the received signal by the FFT processor 500, $\hat{\alpha}_k$ is:

$$\begin{bmatrix} \hat{a_{k,i}} \\ \hat{a_{k,q}} \end{bmatrix} = \begin{bmatrix} M_{11} & M_{12} \\ M_{21} & M_{22} \end{bmatrix} \begin{bmatrix} a_{k,i} \\ a_{k,q} \end{bmatrix} \quad (14)$$

$$= \begin{bmatrix} c_i + d_i & -(c_q + d_q) \\ c_q + d_q & c_i + d_i \end{bmatrix} \cdot \begin{bmatrix} a_{k,i} \\ a_{k,q} \end{bmatrix}$$

$$= \begin{bmatrix} \alpha_r \cos\theta_r & \beta_r \sin\phi_r \\ -\beta_r \sin\phi_r & \alpha_r \cos\theta_r \end{bmatrix} \cdot \begin{bmatrix} a_{k,i} \\ a_{k,q} \end{bmatrix} \quad (15)$$

When $a_{k,i}=-a_{-k,i}$ (symmetric) and $a_{k,q}=a_{-k,q}$ (symmetric), only an imaginary-part time-domain OFDM signal is transmitted. By transmitting this signal through only one of the I and Q modulation paths (In this embodiment, the signal is transmitted through the I modulation path and carried by a sine ($-\sin(\omega_c t)$) carrier and demodulating the received signal by the FFT processor 500, $\hat{\alpha}_k$ is turned to be:

$$\begin{bmatrix} \hat{a_{k,i}} \\ \hat{a_{k,q}} \end{bmatrix} = \begin{bmatrix} c_i - d_i & -(c_q - d_q) \\ c_q - d_q & c_i - d_i \end{bmatrix} \cdot \begin{bmatrix} a_{k,i} \\ a_{k,q} \end{bmatrix} \quad (16)$$

$$= \begin{bmatrix} \beta_r \cos\phi_r & \alpha_r \sin\theta_r \\ -\alpha_r \sin\theta_r & \beta_r \cos\phi_r \end{bmatrix} \cdot \begin{bmatrix} a_{k,i} \\ a_{k,q} \end{bmatrix} \quad (17)$$

Thus, from the equation (15), if $a_{k,i}=a_{k,q}=1$, and $a_{-k,i}=a_{k,i}$ and $a_{-k,q}=-a_{k,q}$, then $$\hat{\alpha}_{k,j}=\alpha_r \cos\theta_r + \beta_r \sin\phi_r$$

$$\hat{\alpha}_{k,q}=-\beta_r \sin\phi_r + \alpha_r \cos\theta_r \quad (18)$$

$$\alpha_r \cos\theta_r = \frac{\hat{a_{k,i}} + \hat{a_{k,q}}}{2} \quad (19)$$

$$\beta_r \sin\phi_r = \frac{\hat{a_{k,i}} - \hat{a_{k,q}}}{2}$$

From the equation (17), if $a_{k,i}=a_{k,q}=1$, and $a_{-k,i}=-a_{k,i}$ and $a_{-k,q}=a_{k,q}$, then $$\hat{a_{k,i}} = \alpha_r \sin\theta_r + \beta_r \cos\phi_r \quad (20)$$

$$\hat{a_{k,q}} = -\beta_r \cos\phi_r - \alpha_r \sin\theta_r$$

$$\alpha_r \sin\theta_r = \frac{\hat{a_{k,i}} - \hat{a_{k,q}}}{2} \quad (21)$$

$$\beta_r \cos\phi_r = \frac{\hat{a_{k,i}} + \hat{a_{k,q}}}{2}$$

Figure 3:
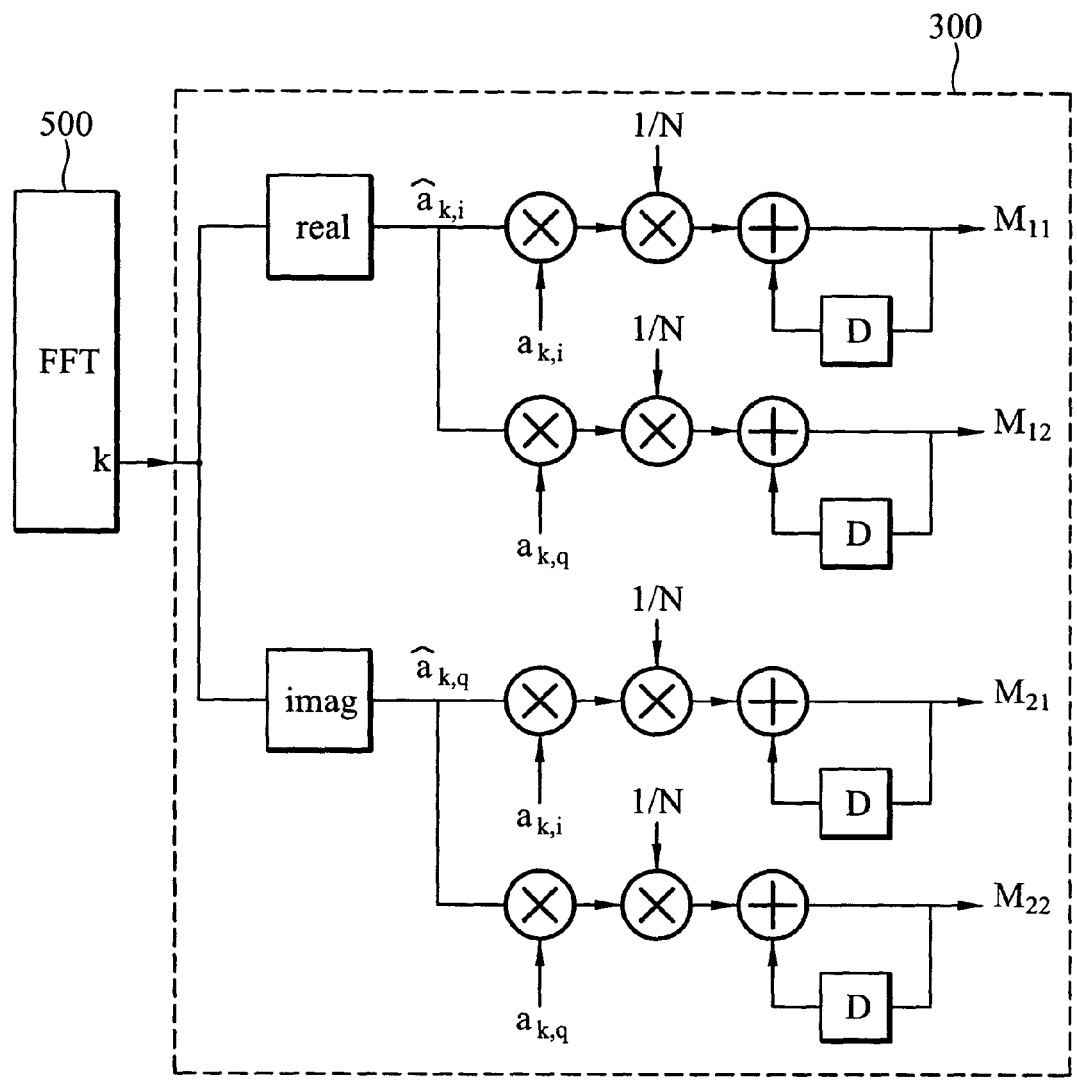
FIG. 3 is a diagram showing an estimator used in the apparatus for estimation and compensation of I/Q imbalance according to one embodiment of the invention.

Alternatively, the parameters $\alpha_r \cos\theta_r$, $\alpha_r \sin\theta_r$, $\beta_r \cos\phi_r$ and $\beta_r \sin\phi_r$ for the receiver I/Q imbalance compensation may also be estimated by correlation of predetermined and independent frequency-domain signals wherein $a_{k,i}=a_{k,q}=\pm 1$ with the corresponding signal received by the receiver. FIG. 3 is a diagram showing an estimator used in the apparatus for estimation and compensation of I/Q imbalance according to the embodiment of the present invention. The values of M11, M12, M21 and M22 are $\alpha_r \cos\theta_r$, $\alpha_r \sin\theta_r$, $\beta_r \sin\phi_r$ and $\beta_r \cos\phi_r$ respectively, and are sent to the receiving compensating matrix circuit 150. N is the number of the transmitted symbols. The multipliers shown in FIG. 3 may be replaced by inverters or shift registers. This simplified parameter estimation and determine estimator may apply to a communication (transmitter/receiver) system having an RF circuit without DC bias for transmitting the continuous deterministic signals.

The transmitter I/Q imbalance is estimated by transmitting two OFDM signals with $a_{k,i}=a_{-k,i}$ and $a_{k,q}=a_{-k,q}$ through the I and Q modulation path respectively so that $$\begin{bmatrix} \hat{a_{k,i}} \\ \hat{a_{k,q}} \end{bmatrix} = \begin{bmatrix} c_i + d_i & -c_q + d_q \\ c_q + d_q & c_i - d_i \end{bmatrix} \cdot \begin{bmatrix} a_{k,i} \\ a_{k,q} \end{bmatrix} \quad (22)$$

$$= \begin{bmatrix} \alpha_t \cos\theta_t & -\beta_t \sin\phi_t \\ \alpha_t \sin\theta_t & \beta_t \cos\phi_t \end{bmatrix} \cdot \begin{bmatrix} a_{k,i} \\ a_{k,q} \end{bmatrix} \quad (23)$$

In order to avoid the impact of receiver I/Q imbalance, only one single demodulation path (either real-part modulation path I_tx or imaginary-part modulation path Q_tx of the receiving node) is used during the estimation of transmitter I/Q imbalance. The real-part of the time-domain signal is demodulated alone using a cosine ($\cos(\omega_c t)$ carrier wave and the imaginary-part time-domain signal is demodulated alone using a sine ($\sin(\omega_c t)$) carrier wave in different time period.

When $a_{k,i}=a_{-k,i}$ (symmetric) and $a_{k,q}=a_{-k,q}$ (symmetric) that is both the real-part and the imaginary-part frequency domain signal are symmetric, the time-domain OFDM signal is transmitted through the Q demodulation path Q_rx and is demodulated using a cosine ($\cos(\omega_c t)$) carrier wave to demodulate the real-part time-domain signal. Then the real-part time-domain signal is converted to frequency domain by the FFT processor 500 so that $$\begin{bmatrix} \hat{a_{k,i}} \\ \hat{a_{k,q}} \end{bmatrix} = \begin{bmatrix} c_i + d_i & -c_q + d_q \\ 0 & 0 \end{bmatrix} \cdot \begin{bmatrix} a_{k,i} \\ a_{k,q} \end{bmatrix} \quad (24)$$

$$= \begin{bmatrix} \alpha_t \cos\theta_t & -\beta_t \sin\phi_t \\ 0 & 0 \end{bmatrix} \cdot \begin{bmatrix} a_{k,i} \\ a_{k,q} \end{bmatrix} \quad (25)$$

If the time-domain OFDM signal is transmitted through the Q demodulation path Q_rx and is demodulated using a sine ($\sin(\omega_c t)$) carrier wave to demodulate the imaginary-part time-domain signal. Then the imaginary-part time-domain signal is converted to frequency domain by the FFT processor 500 so that $$\begin{bmatrix} \hat{a_{k,i}} \\ \hat{a_{k,q}} \end{bmatrix} = \begin{bmatrix} 0 & 0 \\ c_q + d_q & c_i - d_i \end{bmatrix} \cdot \begin{bmatrix} a_{k,i} \\ a_{k,q} \end{bmatrix} \quad (26)$$

-continued $$= \begin{bmatrix} 0 & 0 \\ \alpha_t \sin\theta_t & \beta_t \cos\phi_t \end{bmatrix} \cdot \begin{bmatrix} a_{k,i} \\ a_{k,q} \end{bmatrix} \quad (27)$$

By using the system and method disclosed above with the OFDM signals that $a_{k,i}=a_{-k,i}$ (symmetric) and $a_{k,q}=a_{-k,q}$ (symmetric), the parameters of $\alpha_t \cos\theta_t$, $\alpha_t \sin\theta_t$, $\beta_t \sin\phi_t$ and $\beta_t \cos\phi_t$ can be determined respectively. Alternatively, the parameters for compensation of the transmitter I/Q imbalance may also be derived by the estimator shown in FIG. 3, wherein the values of $M_{11}$, $M_{12}$, $M_{21}$ and $M_{22}$ are $\alpha_t \cos\theta_t$, $-\beta_t \sin\phi_t$, $\alpha_t \sin\theta_t$ and $\beta_t \cos\phi_t$ respectively. These parameters are for use by the transmitting compensation matrix circuit 250.

Figure 4A:
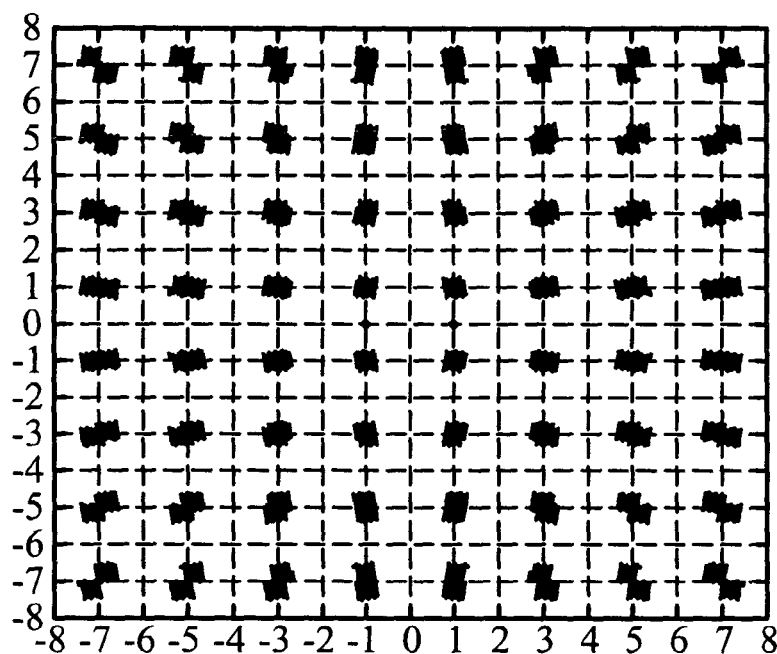
FIGS. 4A and 4B respectively show constellations of an imbalanced modulation before and after the compensation.
Figure 4B:
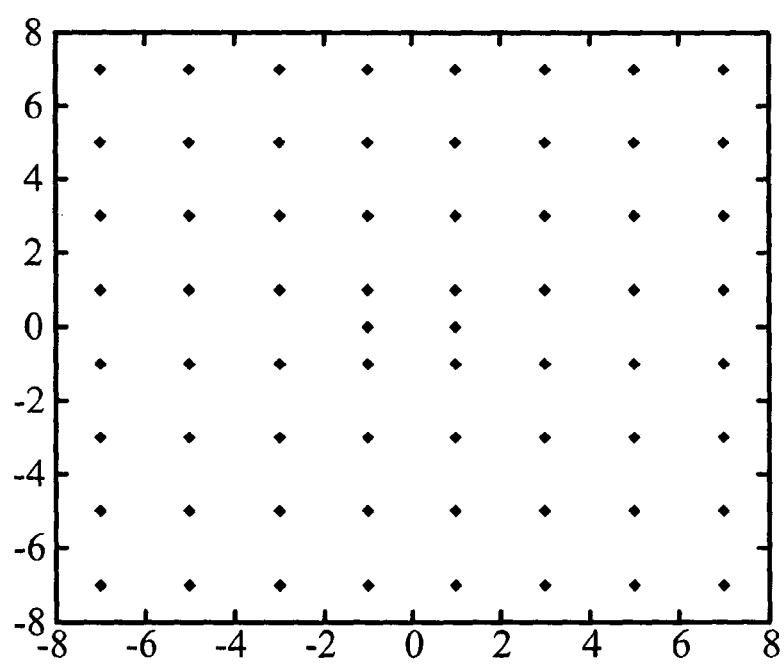

FIGS. 4A and 4B respectively show constellations of an imbalanced modulation before and after the compensation.

It should be noted that the relation between the $a_{k,i}$, $a_{k,i}$, $a_{k,q}$ and $a_{k,q}$ is not necessarily limited to that described previously. The receiver I/Q imbalance may be estimated only by transmitting the signal through the same modulation path and the transmitter I/Q imbalance may be estimated only by receiving the signal through the same demodulation path. However, this increases difficulty in baseband signal processing.

The present invention takes advantage of the modulation/demodulation characteristics of OFDM signals to estimate the receiver and transmitter I/Q imbalance, and further uses a specifically predetermined signal to simplify the estimation.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for estimating an I/Q imbalance parameter of a receiver, comprising the steps of:
    transmitting a first signal modulated by a first and a second modulated carrier through only a single modulation path at a transmitter;
    receiving the first signal demodulated by a first demodulated carrier and a second demodulated carrier, respectively through first and second demodulation paths at a receiver;
    transmitting a second signal modulated by the first and the second modulated carrier through the single modulation path at the transmitter;
    receiving the second signal demodulated by the first and the second demodulated carrier respectively through the first and second demodulation paths at the receiver; and
    deriving the I/Q imbalance parameter of the receiver according to the first signal and the second signal transmitted by the transmitter and the demodulated first and second signals received by the receiver, wherein the first and second signals are symmetrical in the frequency domain.

2. The method of claim 1, wherein the first modulated carrier is a real-value modulated carrier, the second modulated carrier is an imaginary-value modulated carrier, the modulation path is one of I_channel and Q_channel, the first demodulation path is a I_channel, the second demodulation path is a Q_channel, the first demodulated carrier is a real-value demodulated carrier, and the second demodulated carrier is an imaginary-value demodulated carrier.

3. The method of claim 1, wherein the real part of the first signal is symmetric while the imaginary part of the first signal is anti-symmetric in the frequency domain.

4. The method of claim 3, wherein amplitudes of the real and imaginary part of the first signal are the same in the frequency domain.

5. The method of claim 1, wherein the real part of the second signal is anti-symmetric while the imaginary part of the second signal is symmetric in the frequency domain.

6. The method of claim 5, wherein amplitudes of the real and imaginary part of the second signal are the same in the frequency domain.

7. The method of claim 1, wherein the amplitude of the real and the imaginary part of the first and second signals are either +1 or −1.

8. An apparatus for estimation of transmitter I/Q imbalance in a communication system, the apparatus comprising:
    a signal generator for generating a first and a second signals, wherein the first and the second signals are symmetrical in the frequency domain;
    a transmitter for transmitting both the first signal modulated by a first modulated carrier and the second signal modulated by a second modulated carrier through only one of a first modulation path or a second modulation path; and
    an estimator for deriving an I/Q imbalance parameter of the transmitter according the first signal and the second signal received by a receiver.

9. The apparatus of claim 8, wherein the signal generator further comprises an IFFT processor.

10. The apparatus of claim 8, wherein the real and the imaginary part of the first and the second signal are symmetric in the frequency domain.

11. The apparatus of claim 8, wherein amplitudes of the real and the imaginary part of the first and the second signal are the same in the frequency domain.

12. An apparatus for estimation of receiver I/Q imbalance in a communication system, comprising:
    a signal generator for generating a first and a second signal;
    a transmitter for transmitting the first signal modulated by a first modulated carrier and the second signal modulated by a second modulated carrier, wherein both the first and the second signals are transmitted through a single I_channel or through a single Q_channel;
    a receiver for receiving the first signal demodulated by a first demodulated carrier through a I_channel and demodulated by a second demodulated carrier through a Q_channel, and receiving a second signal demodulated by a first demodulated carrier through a I_channel and demodulated by a second demodulated carrier through a Q_channel; and
    an estimator for deriving an I/Q imbalance parameter of the receiver from the first signal and the second signal received by the receiver and the first and second signals transmitted by the transmitter.

13. The apparatus of claim 12 the receiver further comprising a FFT processor.

14. The apparatus of claim 12, wherein the real part of the first signal is symmetric while the imaginary part of the first signal is anti-symmetric in the frequency domain.

15. The apparatus of claim 14, wherein amplitudes of the real and the imaginary part of the first signal are the same in the frequency domain.

16. The apparatus of claim 12, wherein the real part of the second signal is anti-symmetric while the imaginary part of the second signal is symmetric in the frequency domain.

17. The apparatus of claim 16, wherein amplitudes of the real and the imaginary part of the second signal are the same in the frequency domain.

18. The apparatus of claim 12, wherein the real and the imaginary part of the first and the second signal are either +1 or −1.

* * * * *